(12) United States Patent
Faison et al.

(10) Patent No.: US 6,268,776 B1
(45) Date of Patent: Jul. 31, 2001

(54) DIGITALLY TUNED AND LINEARIZED LOW VOLTAGE CRYSTAL OSCILLATOR CIRCUIT

(76) Inventors: Kevin G. Faison, 16 W. Pleasant Hill Rd., Owings Mills; Eric Naviasky, 8414 Governors Run; Martin J. Mengele, 8527 High Ridge Rd., both of Ellicott City, all of MD (US) 21043

( * ) Notice: Subject to any disclaimer, the term of this patent is extended or adjusted under 35 U.S.C. 154(b) by 0 days.

(21) Appl. No.: 09/434,677

(22) Filed: Nov. 5, 1999

Related U.S. Application Data

(60) Provisional application No. 60/107,481, filed on Nov. 6, 1998.

(51) Int. Cl.[7] .................................. H03B 5/32; H03B 5/36

(52) U.S. Cl. .............................. 331/116 FE; 331/116 R; 331/158; 331/179

(58) Field of Search ............................ 331/36 C, 116 R, 331/116 FE, 158, 179

(56) References Cited

U.S. PATENT DOCUMENTS

| | | | | |
|---|---|---|---|---|
| 4,805,198 | * | 2/1989 | Stern et al. | 375/118 |
| 4,814,640 | * | 3/1989 | Miyake | 302/303 |
| 4,827,226 | * | 5/1989 | Connell | 331/116 FE |
| 4,941,156 | * | 7/1990 | Stern et al. | 375/118 |
| 5,036,294 | * | 7/1991 | McCaslin | 331/1 A |
| 6,104,257 | * | 8/2000 | Mann | 331/158 |

* cited by examiner

*Primary Examiner*—David Mis
(74) *Attorney, Agent, or Firm*—Stanley N. Protigal; John F. Schipper

(57) ABSTRACT

A digitally tuned and linearized low voltage crystal oscillator integrated circuit requires only an oscillator crystal as external circuitry. The inventive circuit operates at voltages of 3.3V and below and requires no other off-chip components. A crystal oscillator, such as a Pierce crystal oscillator uses an inverting gain stage and a phase shift network composed of an array of switchable capacitors and the crystal. The design offers improvements in power consumption, area, manufacturability and cost.

9 Claims, 9 Drawing Sheets

DIGITALLY TUNED AND LINEARIZED LOW VOLTAGE CRYSTAL OSCILLATOR CIRCUIT

This application claims the benefit of U.S. Provisional Application No. 60/107,481, filed Nov. 6, 1998.

FIELD OF THE INVENTION

This invention relates to oscillators. More particularly, the invention relates to digitally tuned oscillators such as those used in digital communications systems.

BACKGROUND OF THE INVENTION

Tunable crystal oscillators are used in communication systems to implement highly stable frequency sources with excellent spectral purity. These circuits are critical in digital communication systems such as high speed modems that require precision timing to achieve stringent bit error rate specifications.

FIG. 1 shows a typical application of tunable crystal oscillators in a simplified communication link consisting of a home modem, remote modem and a channel linking them. Each modem utilizes precision clocks and timing circuitry that is ultimately derived (using phase locked loops or other methods) from its own local tunable crystal oscillator.

Although these crystal based oscillators are very precise there still exists a slight frequency offset between the home and remote oscillators. This offset prevents data transmitted by one modem from being received by the other modem reliably unless some means is used to synchronize the receiver clock with the transmitter clock. The process of synchronizing the receiver clock to the transmitter clock is usually referred to as clock recovery. In the receiver, the clock recovery loop extracts timing information from the transmitted data and uses it to adjust the receiver local crystal oscillator until it matches the frequency and phase of the transmitter local oscillator. A typical clock recovery loop block diagram that includes the tunable crystal oscillator is shown in FIG. 2. These loops may be implemented using a mix of digital and analog hardware. A portion of the loop may also be implemented as part of a software algorithm executing in a digital processor depending on the overall system constraints. The simplified clock recovery loop includes a tunable crystal oscillator in a feedback loop. When the feedback control signal to the local oscillator is a digital word it is desirable to utilize a digitally tuned crystal oscillator. The usual Pierce oscillator design, shown in FIG. 3, includes an inverting gain stage driving a phase shift network composed of a shunt capacitor on each side of the series branch crystal as shown in the Figure.

When the output of the phase shift network is fed back to the amplifier input, the circuit will oscillate at a frequency between ωs (series resonant frequency) and ωp (parallel resonant frequency) of the crystal, assuming adequate loop gain. The oscillation frequency may be tuned (pulled) by changing the capacitance in the phase shift network. This can be done under EMF (voltage) control by replacing the fixed capacitors by varactor diodes to implement voltage variable capacitors. FIGS. 4A and 4B show typical digitally tuned crystal oscillator implementations based on the commonly used Pierce oscillator topology. Digital control is obtained by using a digital-to-analog converter to drive the varactor diode and results in the prior art topology of FIG. 4A. The varactor requires varied EMF (voltage) for control, and a separate digital-to-analog converter was used. The EMF ranges for the varactor are disadvantageous when constructing circuits designed for 3 volt operation. In this circuit, a digitally controlled Pierce oscillator uses an A/D converter and a varactor diode for frequency tuning. FIG. 4B shows the addition of an inductor in parallel with a varactor. Pierce oscillators are limited in their use on low voltage integrated circuits because:

1. To tune the oscillator over an adequate frequency range, say +/−125 ppm, the tuning capacitors change typically by a ratio of 10:1 or more. To achieve this variation in capacitance using varactor diodes requires a large range in tuning voltage, generally greater than 12V. This requirement is incompatible with modern low power communication systems constrained by 3.3V or lower supplies.
2. The addition of the digital-to-analog converter adds considerable circuit complexity, consumes significant chip area, lowers manufacturing yield and increases cost and power consumption.
3. Adequate tuning varactors are not available for most modern low cost, low voltage IC processes. This means they must be placed off chip, adversely impacting product size, cost, reliability and manufacturability.

As shown in FIG. 4B, it possible to use an inductor in parallel with the tuning capacitor (varactor). The parallel L-C network is designed to present an overall capacitive reactance near the oscillation frequency but achieves a higher reactance slope. The parallel L-C network exhibits faster reactance changes in response to changes in EMF. It is estimated that this technique may drop the tuning voltage requirement from 12 or more volts to about 5 volts, but this is still inadequate for inclusion in modern 0.351im and 0.25tm integrated circuit processes operating at 3.3V and 2.5V respectively. In addition to the problems outlined for the circuit of FIG. 3, this design also requires an off-chip inductor which adversely impacts size, cost, reliability and manufacturability. Prior art systems were difficult to configure in such a way as to meet the tuning requirements at 3.3V and below. Therefore, prior art systems consumed more power.

If a capacitance is used to tune the Pierce oscillator, the response of the Pierce oscillator tends to be nonlinear. This causes the device to exhibit instability, as the tuning becomes overly sensitive at some points and causes the device to exhibit low response at other points.

SUMMARY OF THE INVENTION

According to the present invention, a digitally tuned and linearized low voltage crystal oscillator integrated circuit is provided. According to the present invention, tunable capacitors required to vary the oscillation frequency are implemented in the integrated circuit as a switchable array of on-chip capacitors. The oscillator is tuned across its range by switching in or out portions of the capacitor array A linearized tuning response is achieved by applying weighting to the array.

According to the present invention, an on-chip capacitor array is used to tune the oscillator. This contrasts with the use of off-chip varactor diodes and avoids a requirement for off-chip inductors to allow for the control of the varactors. An on-chip decoder circuit is used in conjunction with weighting to linearize the tuning response of the oscillator. This provides a linearized response. According to the present invention, a discretized capacitor array and decode logic are used to provide the capacitance.

According to the present invention, a crystal based tunable oscillator operates at 3.3V and below with a tuning range suitable for a wide array of communication systems. This is especially critical for low voltage portable consumer electronics. A circuit constructed according to the present invention uses weighting techniques to linearize the oscillator tuning response. This allows for implementation of more robust and more easily manufactured PLL and clock recovery loop (CRL) designs and leads to higher performance systems. The prior art has very nonlinear and poorly controlled tuning characteristics making PLL and CRL designs difficult and manufacturing more expensive.

According to the present invention, no off-chip components are required with the exception of the crystal. This reduces cost and size and improves system reliability and manufacturability. In contrast, the prior art requires a significant number of external components.

The inventive circuit implements digital control via a discretized capacitor array and thus saves die area, cost and power by not requiring a digital to analog converter. The prior art requires a DIA converter to implement the digital control.

DETAILED DESCRIPTION OF THE PREFERRED EMBODIMENTS

Figure 1:
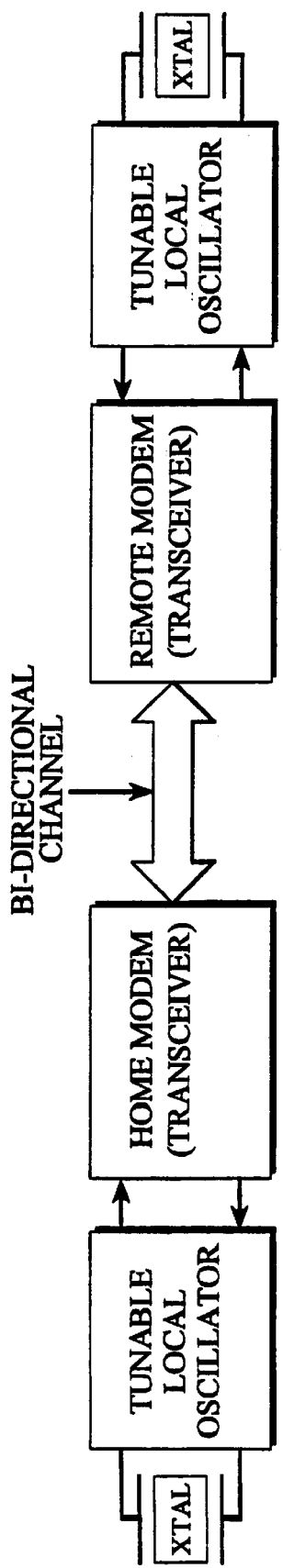
FIG. 1 shows a typical application of a tunable crystal oscillator.
Figure 2:
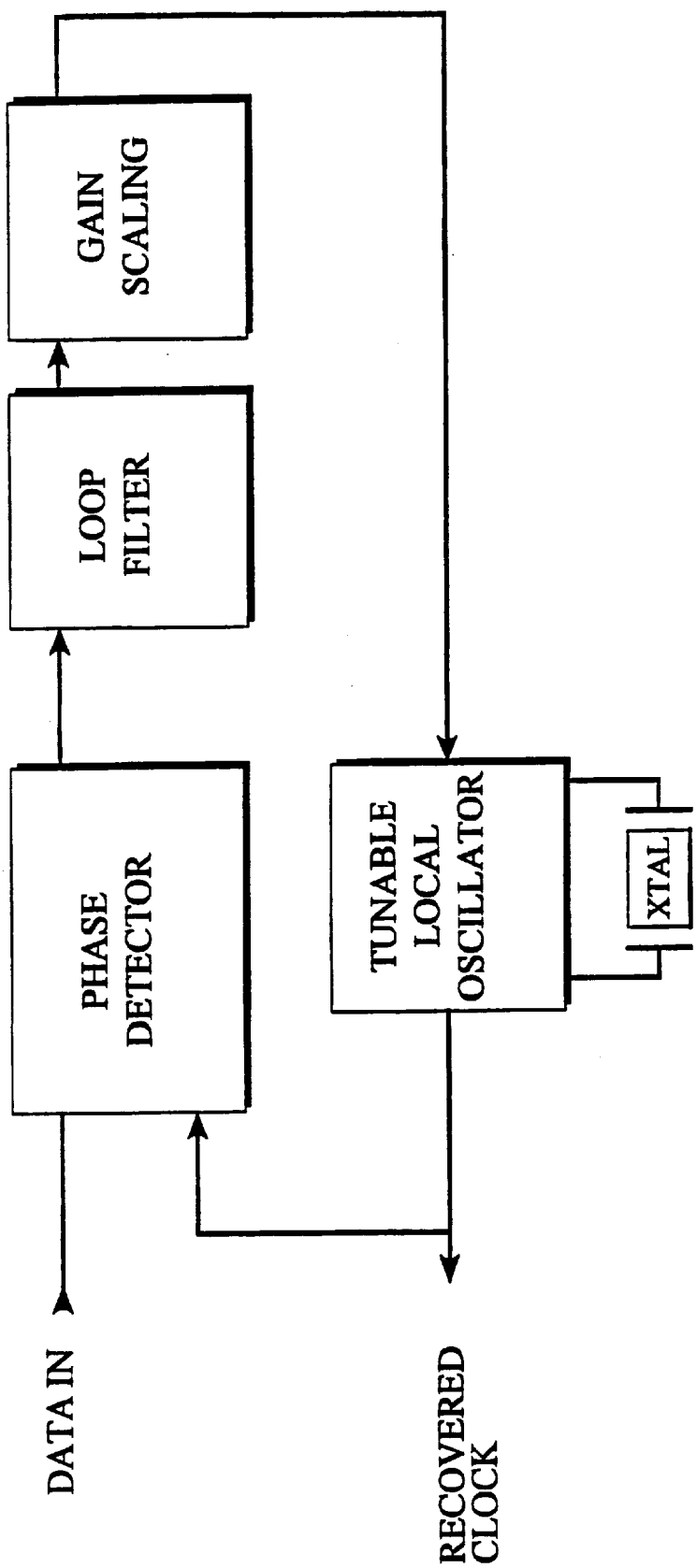
FIG. 2 is a block diagram of a typical clock recovery loop that includes a tunable crystal oscillator.
Figure 3:
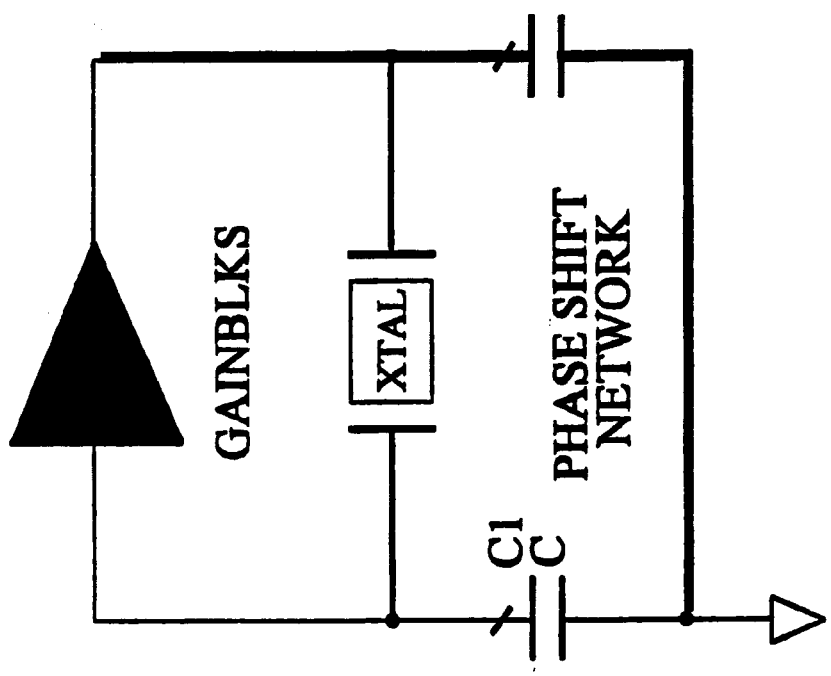
FIG. 3 is a diagram of a representative Pierce oscillator design used in the prior art.
Figure 4A:
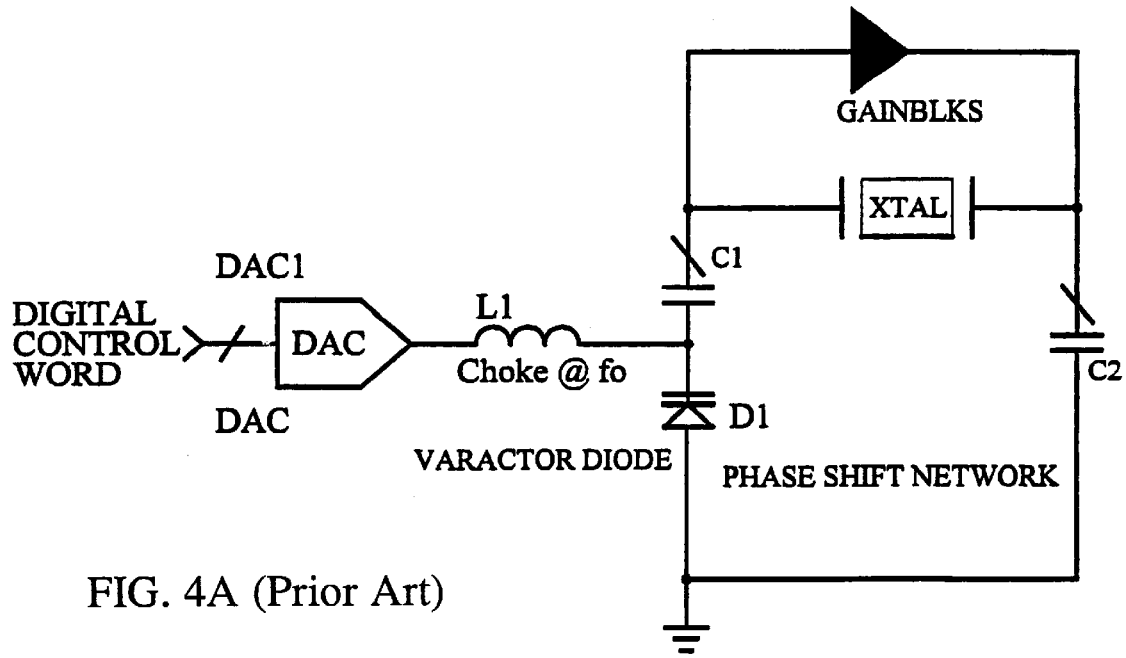
FIGS. 4A and 4B are block diagrams showing typical digitally tuned crystal oscillator implementations based on Pierce oscillator topology used in the prior art, FIG. 4A showing digitally controlled Pierce oscillator using an A/D converter and varactor diode for frequency tuning, and FIG. 4B showing the addition of an inductor in parallel with a varactor.
Figure 4B:
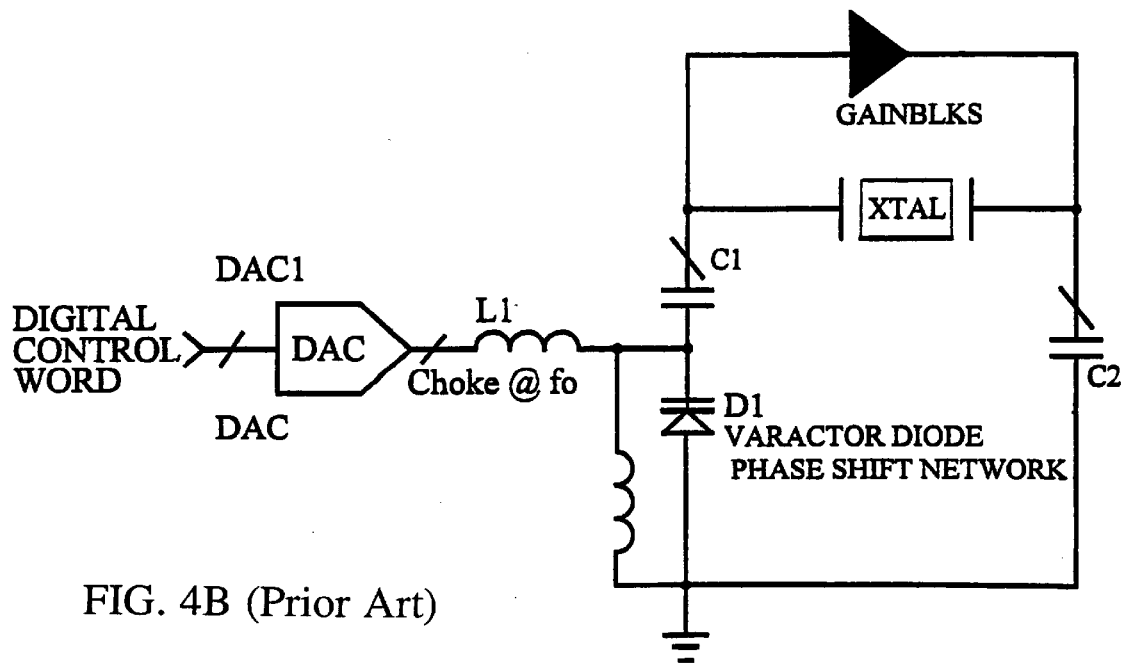
Figure 5:
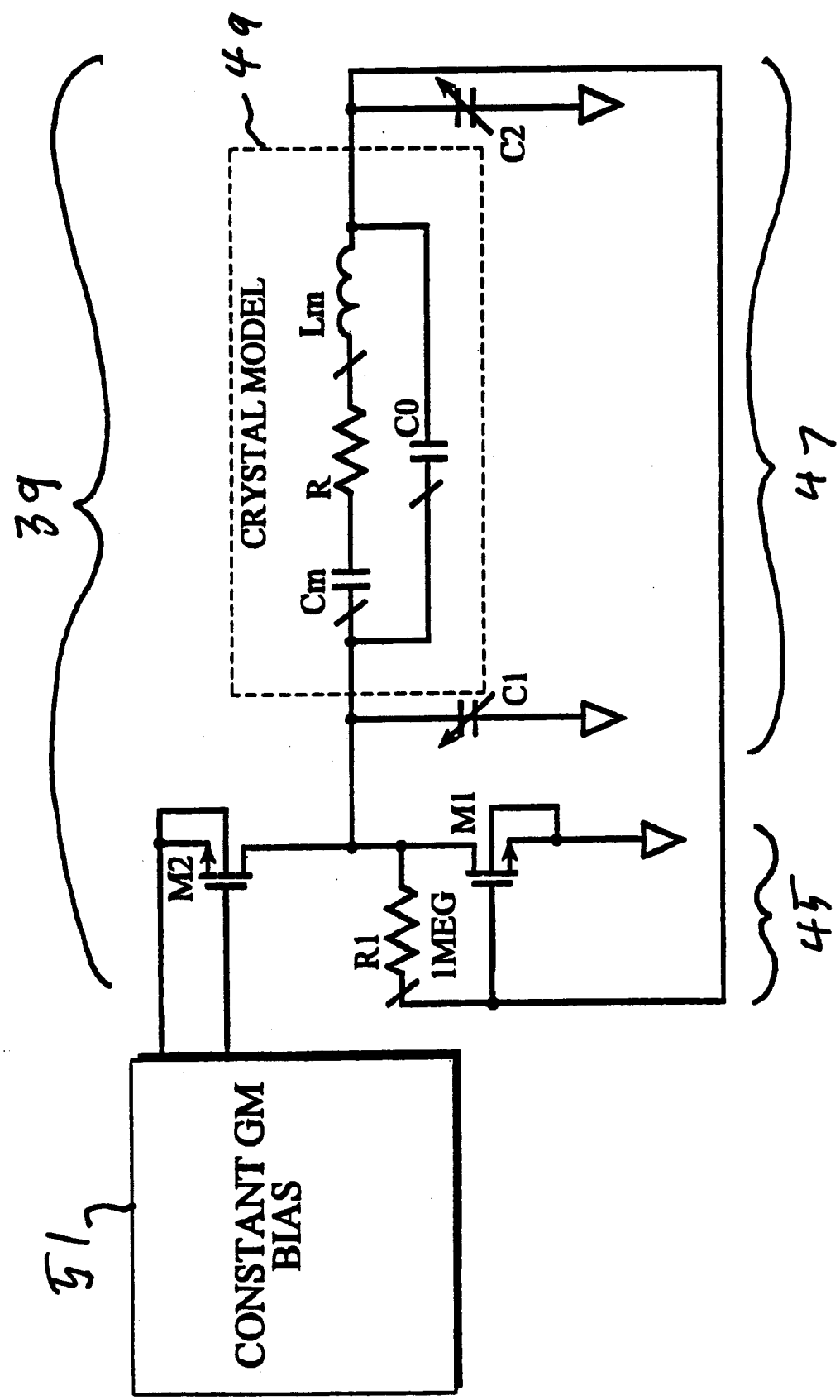
FIG. 5 is a block diagram of a simplified Pierce crystal oscillator with variable capacitors for frequency tuning according to the present invention.

FIG. 5 shows a simplified Pierce crystal oscillator 39 with variable capacitors C1, C2 for frequency tuning. The components within the dotted line represent the equivalent electrical model of the quartz crystal. Referring to the schematic of FIG. 5, the Pierce crystal oscillator topology consisting of an inverting gain stage 45, which cooperates with a phase shift network 47. The phase shift network 47 is composed of tunable capacitors C1, C2 and a crystal 49. (The crystal equivalent circuit is shown within the dashed line.) A bias circuit 51 supplies current to the oscillator.

The circuit oscillates at a frequency where the phase shift through the phase shift network is 180 degrees. This frequency may be changed by changing the value of the variable capacitors.

Tunable capacitors required to vary the oscillation frequency are implemented in the integrated circuit as a switchable array of on-chip capacitors. In the prototype these capacitors may be switched from a minimum value of 5 pF to a maximum value of 55 pF to achieve +/-125 pm (PPM-=22.08 Hz) tuning range at 22.08 MHz. The oscillator is tuned across its range by switching in or out portions of the capacitor array. A linearized tuning response is achieved by applying weighting to the array.

Figure 6:
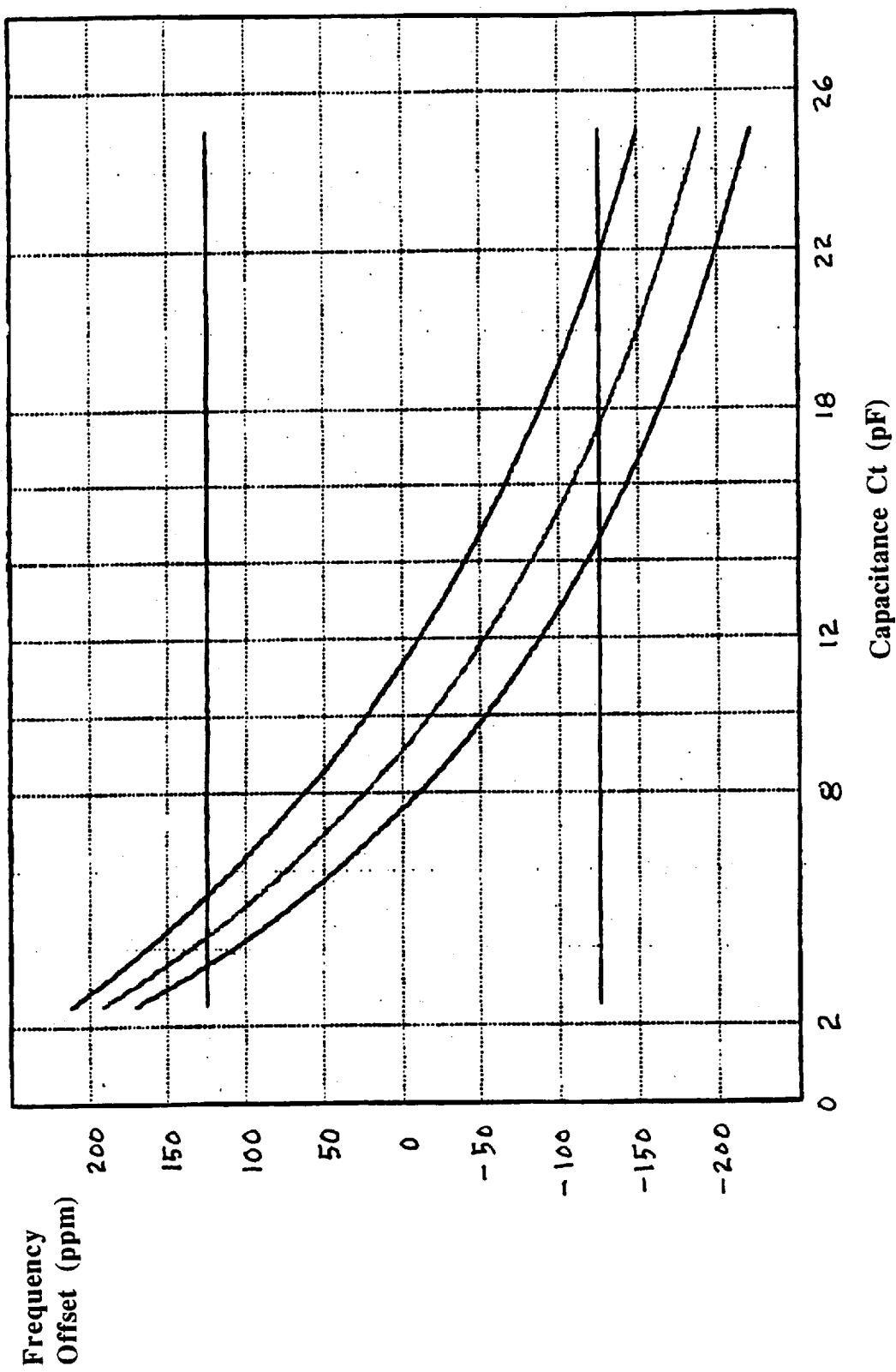
FIG. 6 is a plot of the relationship of oscillator frequency as displacement from a nominal center frequency as a function of tuning capacitor value according to the present invention.

It can be shown that the oscillation frequency may be approximated to high degree by the following expression which is a function of the crystal equivalent circuit and the tuning capacitors. This expression is derived neglecting crystal resistance.

$$\omega o = \left( \frac{Ct - \omega s^2 + Cp - \omega p^2}{Ct + Co} \right)^{0.5}$$

where
Ct—C1 C2/(C1+C2)
Cp=parallel crystal capacitance
$\omega$s=crystal series resonant frequency
$\omega$p=crystal parallel resonant frequency A plot of this relationship is shown in FIG. 6 where the oscillator frequency is plotted as displacement from the nominal center frequency in units of parts-per-million (PPM). In this case the center frequency is 22.08 MHz so that lppm equates to 22.08 Hz.

FIG. 6, is a plot of oscillator frequency shown as a function of tuning capacitor value as calculated for the prototype circuit. The vertical axis is frequency offset in PPM from the oscillator center frequency. The horizontal axis is capacitance Ct in pF. Center plot is nominal valued capacitors, top is for –20% capacitance, bottom is for –20% capacitance.

As shown in the plots to achieve +/-125 PPM of tuning range with +/-20 capacitor variation requires Ct=2.5 PF to 125 pF or, C1-C2=5 pF to 50 pF. In the prior art these tuning capacitors are implemented using varactor diodes which require a wide control voltage swing in order to achieve the required capacitance change. This approach is impractical for low voltage designs (<3.3V) and requires excess off-chip components. It is also worth noting that the oscillation frequency is a nonlinear function of the tuning capacitance value. This results in a widely varying tuning sensitivity which is undesirable for the clock recovery loop applications. Thus if the oscillator is intended for use with clock signal loop applications, widely varying tuning sensitivity is exhibited.

The invention gets around these problems in the following ways. First, the tuning capacitors are implemented on-chip as a switched capacitor array. The array is switched from 5 pF at an offset frequency of +125 ppm to 55 pF at an offset frequency of –125 ppm. The approach eliminates the need for off-chip varactor diodes and RF chokes and could realize a 10:1 capacitance change at low voltages.

Figure 7:
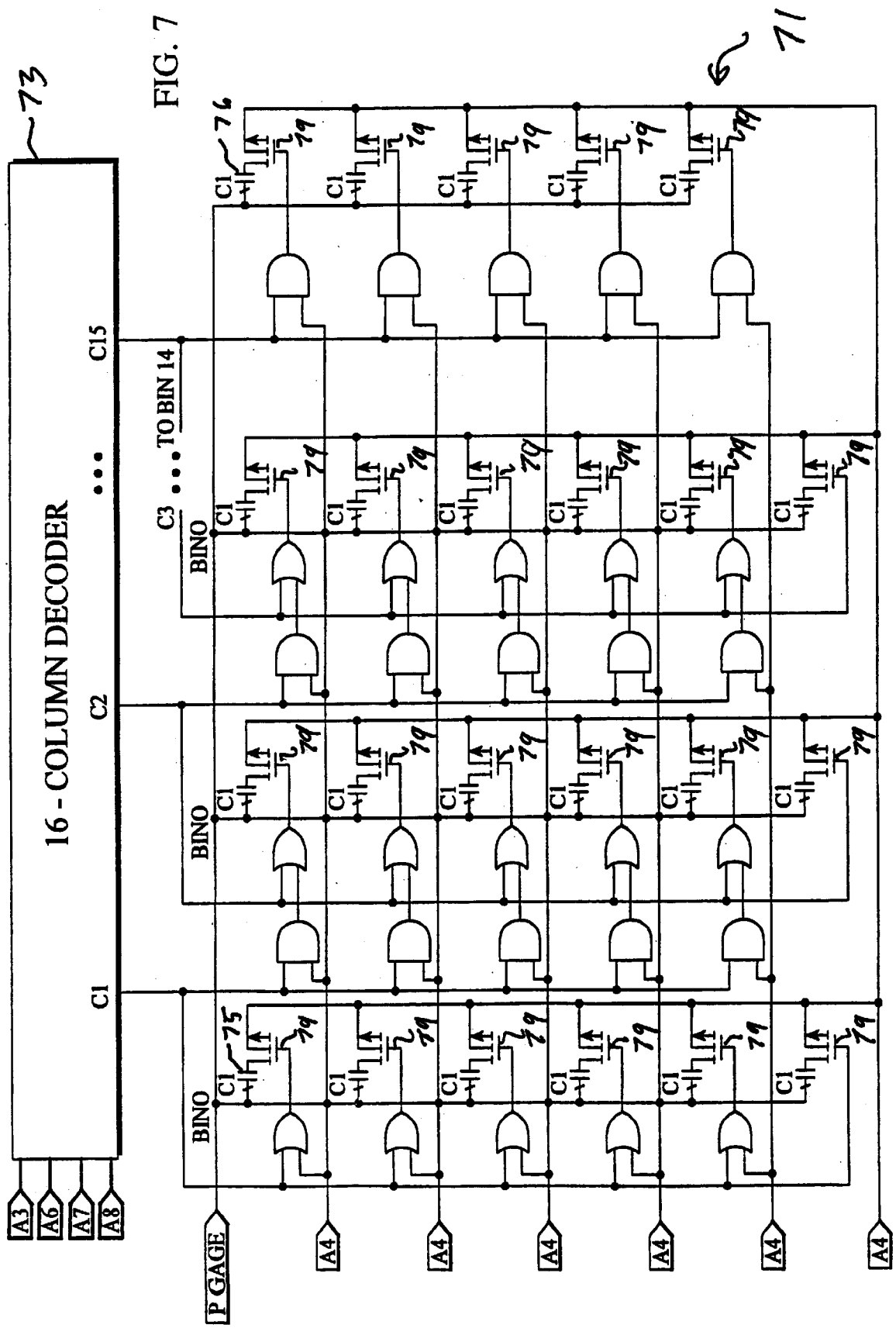
FIG. 7 is a block circuit diagram of an arrangement according to the present invention, in which the tuning curve is linearized by applying nonlinear weighting to the unit capacitors within the array.

In addition, the tuning curve is linearized by applying nonlinear weighting to the unit capacitors within the array. FIG. 7 is a simplified diagram of this arrangement, showing a switched array 71. The 50 pF required for each tuning capacitor is split up into 16 (4-bits) segments, addressed by a 16 column decoder 73. Five bit binary weighting is applied within each segment resulting in nine bits of frequency control. The LSB, or unit capacitor, within each segment is progressively increased across the 16 segments to linearize to an oscillator tuning characteristic. The unit capacitor varies from 38 fF in segment 0, shown as capacitor 75, to 180 fF in segment 15, shown as capacitor 76. At the high frequency boundary, the logic decoder enables column 0. The lower five bits control the gates of FET switches 79 placed in series with MOSFET capacitors. The capacitance is changed from 0*Clsb to 31*Clsb0, where Clsb0=the unit capacitor value for segment 0. When the control word flips from 31 to 32, the column decoder enables column 1 and switches in an additional Clsb0. The entire capacitance string within column 0 remains switched in and the five least significant bits of the control word now control only the capacitor sting within column 1. This process continues until the control word reaches its maximum value at which point all the capacitance within the array is switched in and the oscillator is tuned to it's lowest frequency. In this example, the maximum value is 511.

The starting capacitor value of approximately 5 pF is provided by the sum of the parasitic bottom plate capacitance of all the capacitors making up the array.

As previously mentioned the tuning curve may be linearized by choosing the appropriate values of Clsb0–Clsb31. Computer simulation has been used to verify the selection of these values before fabrication of the prototype circuit. A simulation of the invention, depicted in FIG. 8, shows a vastly improved tuning linearity as well as tuning range in excess of the required +/−125 PPM.

In choosing the prototype values, the capacitors were configured in rows and columns. For a given column, a unit capacitance x was chosen. For subsequent rows, the capacitances were a multiple of the capacitance of the previous row. It was found that doubling the capacitance was effective, so that within a column the first five capacitances were 1x, 2x, 4x, 8x, 16x. The last row in each columned was set at the unit capacitance so the complete column had capacitances of 1x, 2x, 4x 8x, 16x, 1x. In the prototype, the first column used a unit capacitance of 38 fF (38 femtofarads), so that the capacitors in that column were 38 fF, 76 fF, 152 fF, 304 fF, 608 fF, 38 fF. The last unit capacitance facilitated the incrementing of the active capacitors in the array to the next column.

In the prototype, the first column used a unit capacitance of 38 fF, and the next row was 45 fF. The unit capacitances, as read across the top row were 38, 45, . . . , 180 fF, with each column following the arrangement of 1x, 2x, 4x, 8x, 16x, 1x. The last column did not have the final 1x capacitance because there is no need to transition to a next column. Therefore the capacitances in the last column were 1x, 2x, 4x, 8x, 16x.

Figure 8:
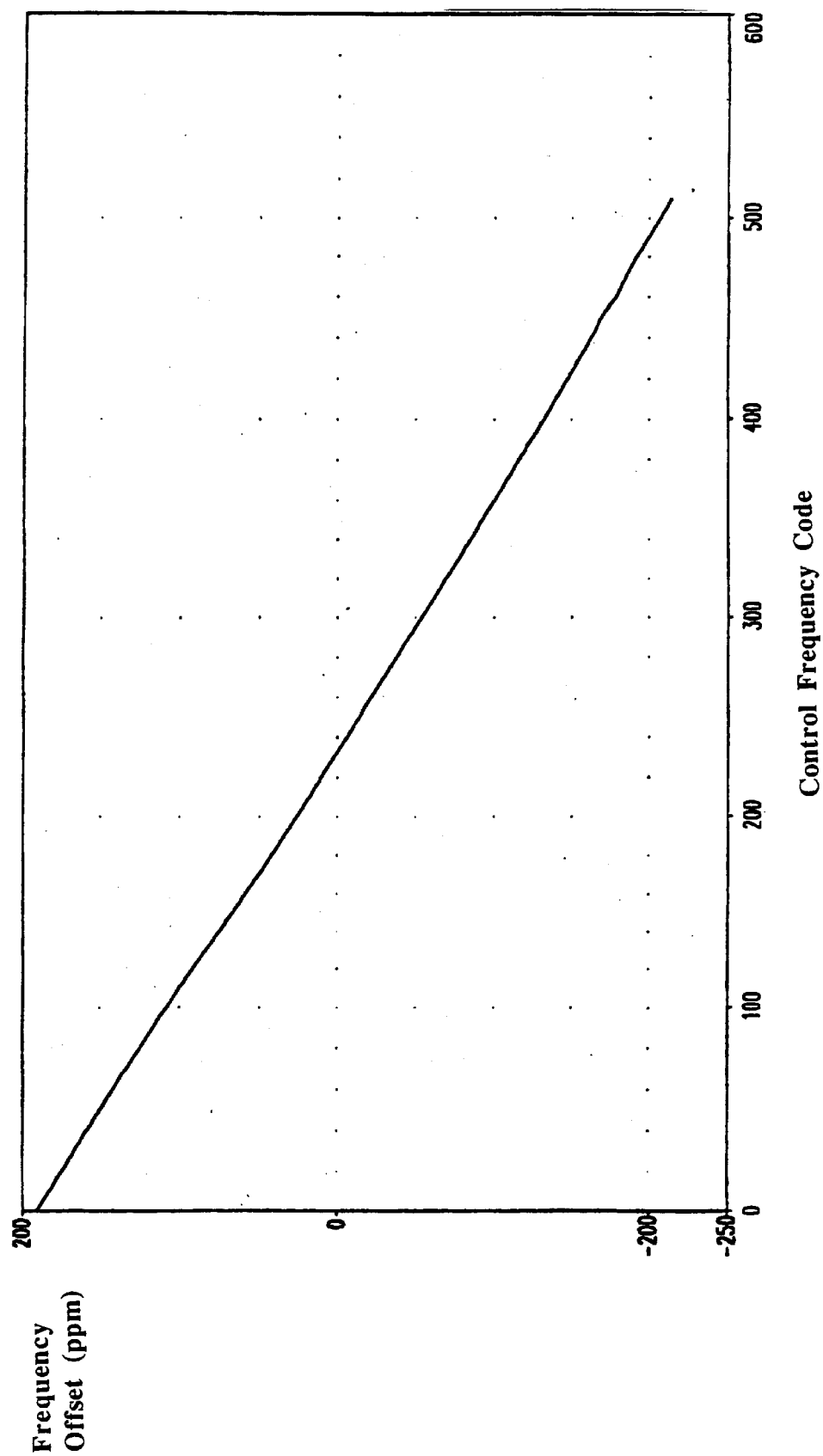
FIG. 8 is a graph depicting a computer simulation of a circuit constructed according to the present invention.

FIG. 8 depicts, computer simulation of the invention. The simulation shows greater than +/−125 PPM tuning range and improved tuning linearity. The vertical axis is frequency in PPM offset from center. The horizontal axis is value of frequency control word, 9-bits 4 bits from the 16-column decoder and 5 bits within each column.

Figure 9:
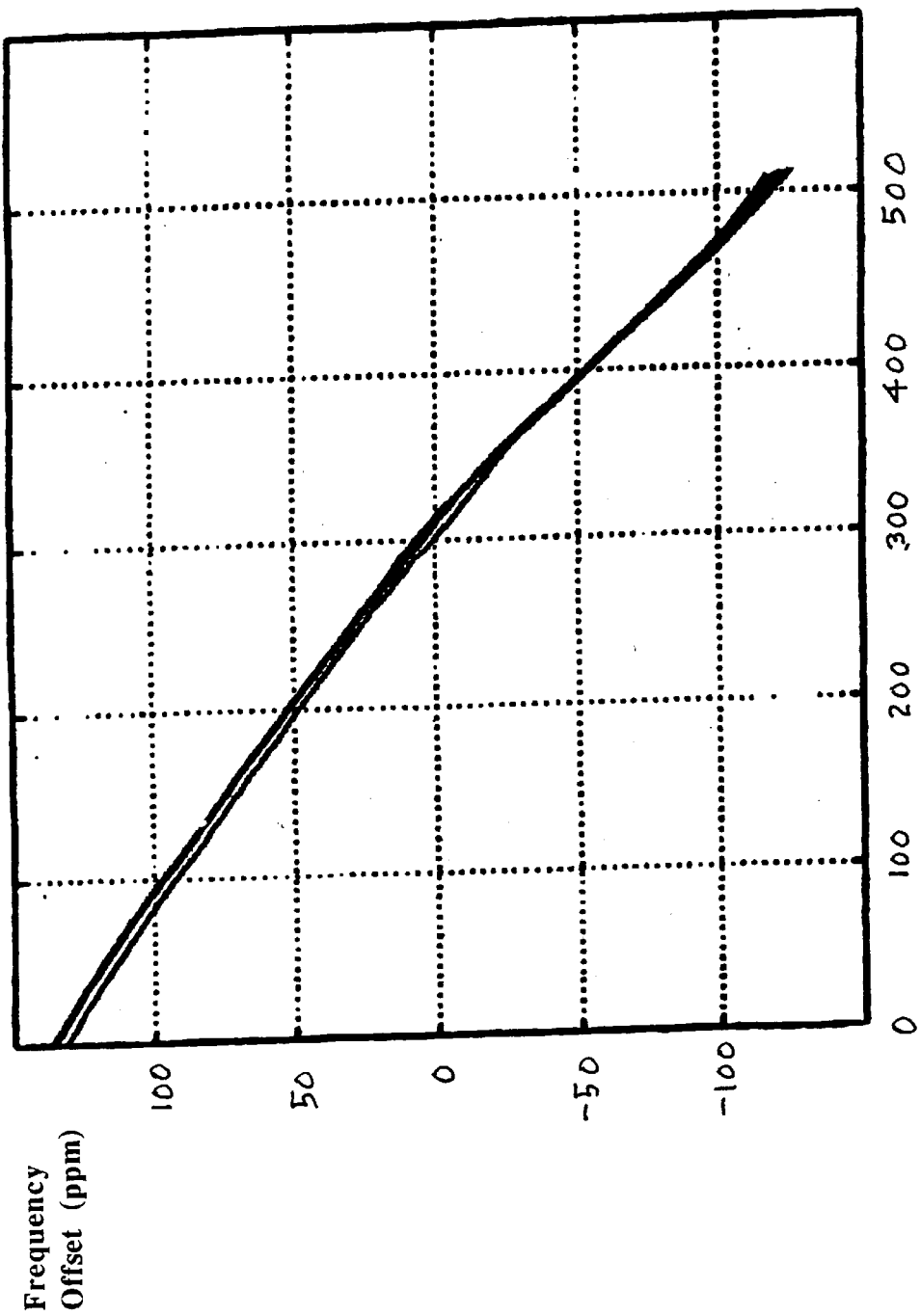
FIG. 9 is a graph depicting a test simulation of results of the invention.

The inventive device has also been demonstrated by fabrication of a prototype. Implemented in 0.35 µm CMOS operating at 3.3V, the prototype has demonstrated a tuning range in excess of +/−125 PPM with good linearity as shown in FIG. 9. The slight deviation in the tuning characteristic from the ideal linear case is due to small circuit parasitics and process variations normally associated with integrated circuit designs of this type.

It should be understood that various modifications within the scope of this invention can be made by one of ordinary skill in the art without departing from the spirit thereof. We therefore wish our invention to be defined by the scope of the appended claims as broadly as the prior art will permit, and in view of the specification if need be.

What is claimed is:

1. A tunable crystal oscillator comprising:
an oscillator circuit including at least one tuning capacitance circuit that comprises:
a switched capacitor array having K columns of switchable capacitors, numbered k=1, 2, . . . , K, where K is a selected positive integer at least equal to $2^M$, where each column has N switchable capacitors, numbered n=1, 2, . . . , N, with selected capacitance values, where M and N are selected positive integers satisfying M+N≧9, where each capacitance value in column number k is a multiple of a selected base value C(k), the base values satisfy C(k)<C(k+1) (k=1, 2, . . . , K−1), and for at least one positive integer k=k0, the ratio C(k0+1)/C(k0) is not an integer; and
an address circuit, connected to the K columns and to the switchable capacitors within each column, that specifies a column and specifies switching of selected capacitors within the specified column by specification of at least M+N bits, and thereby controls the capacitance of the tuning circuit.

2. The tunable crystal oscillator of claim 1, wherein all components except a crystal are fabricated on a single integrated circuit chip.

3. The tunable crystal oscillator of claim 1, wherein, nonlinear weighting is applied to said capacitors in at least one of said columns.

4. The tunable crystal oscillator of claim 1, wherein said switched capacitor array and said address circuit are fabricated on a single integrated circuit chip.

5. The tunable crystal oscillator of claim 1, wherein:
said switched capacitor array and said address circuit are fabricated on a single integrated circuit chip; and
nonlinear weighting is applied to said capacitors in at least one of said columns.

6. The tunable crystal oscillator of claim 1, wherein said base capacitance values C(k) are chosen to provide a substantially linear oscillator tuning characteristic.

7. The tunable crystal oscillator of claim 1, wherein said integers M and N are chosen to be M=4 and N=5.

8. The tunable crystal oscillator of claim 1, wherein a set of said capacitance values for said capacitors within said column number k includes the values j·C(k) with j=1, 2, . . . , $2^M$.

9. The tunable crystal oscillator of claim 1, wherein said oscillator circuit is a Pierce oscillator circuit.

* * * * *